(12) United States Patent
Choi et al.

(10) Patent No.: US 9,666,561 B2
(45) Date of Patent: May 30, 2017

(54) LIGHT EMITTING DEVICE PACKAGE AND LIGHTING APPARATUS INCLUDING THE SAME

(71) Applicant: Samsung Electronics Co., Ltd., Suwon-si (KR)

(72) Inventors: Seol Young Choi, Yongin-si (KR); Sung Soo Park, Suwon-si (KR); Shinya Ishizaki, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/201,507

(22) Filed: Jul. 4, 2016

(65) Prior Publication Data

US 2017/0103966 A1 Apr. 13, 2017

(30) Foreign Application Priority Data

Oct. 12, 2015 (KR) .................. 10-2015-0142005

(51) Int. Cl.
| | |
|---|---|
| *H01L 33/62* | (2010.01) |
| *H01L 25/065* | (2006.01) |
| *H01L 33/08* | (2010.01) |
| *H01L 33/20* | (2010.01) |
| *H01L 33/54* | (2010.01) |
| *H01L 33/32* | (2010.01) |
| *H01L 33/06* | (2010.01) |
| *H01L 27/15* | (2006.01) |

(52) U.S. Cl.
CPC .......... *H01L 25/0655* (2013.01); *H01L 33/06* (2013.01); *H01L 33/08* (2013.01); *H01L 33/20* (2013.01); *H01L 33/32* (2013.01); *H01L 33/54* (2013.01); *H01L 33/62* (2013.01); *H01L 27/156* (2013.01)

(58) Field of Classification Search
CPC ....... H01L 33/36; H01L 33/387; H01L 33/48; H01L 33/62
See application file for complete search history.

(56) References Cited

U.S. PATENT DOCUMENTS

| | | | |
|---|---|---|---|
| 6,372,608 B1 | 4/2002 | Shimoda et al. | |
| 6,645,830 B2 | 11/2003 | Shimoda et al. | |
| RE38,466 E | 3/2004 | Inoue et al. | |
| 6,818,465 B2 | 11/2004 | Biwa et al. | |
| 6,818,530 B2 | 11/2004 | Shimoda et al. | |

(Continued)

FOREIGN PATENT DOCUMENTS

| | | |
|---|---|---|
| KR | 10-2003-0062132 A | 7/2003 |
| KR | 10-2013-0102296 A | 9/2013 |

*Primary Examiner* — Jae Lee
(74) *Attorney, Agent, or Firm* — Muir Patent Law PLLC

(57) ABSTRACT

A light emitting device package may include a printed circuit board and a plurality of light emitting devices mounted on the printed circuit board, wherein a first light emitting device of the plurality of light emitting devices may comprise first to fourth conductor pads formed discretely on the bottom surface of the light emitting device, the printed circuit board comprises first to fourth conductor patterns formed discretely on the top surface of the printed circuit board, and the first to fourth conductor patterns are connected to respective first to fourth conductor pads by respective first to fourth solders.

20 Claims, 13 Drawing Sheets

(56) References Cited

U.S. PATENT DOCUMENTS

| | | |
|---|---|---|
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,179,670 B2 | 2/2007 | Shelton et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,168,470 B2 | 5/2012 | Lin et al. |
| 8,179,938 B2 | 5/2012 | Kim |
| 8,263,987 B2 | 9/2012 | Choi et al. |
| 8,324,646 B2 | 12/2012 | Lee et al. |
| 8,399,269 B2 | 3/2013 | Wang |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,563,342 B2 | 10/2013 | Yoneda et al. |
| 8,735,931 B2 | 5/2014 | Han et al. |
| 8,766,295 B2 | 7/2014 | Kim |
| 8,902,378 B2 | 12/2014 | Lee et al. |
| 2013/0105827 A1* | 5/2013 | Kim ............ H01L 27/15 257/88 |
| 2013/0105828 A1* | 5/2013 | Kim ............ H01L 27/156 257/88 |
| 2015/0001557 A1 | 1/2015 | Yoon et al. |
| 2015/0021638 A1* | 1/2015 | Oh ............ H01L 27/156 257/91 |
| 2015/0364653 A1* | 12/2015 | Chae ............ H01L 33/405 257/98 |

* cited by examiner

LIGHT EMITTING DEVICE PACKAGE AND LIGHTING APPARATUS INCLUDING THE SAME

CROSS-REFERENCE TO RELATED APPLICATION

This application claims the benefit of priority under 35 U.S.C. §119 to Korean Patent Application No. 10-2015-0142005 filed on Oct. 12, 2015, with the Korean Intellectual Property Office, the disclosure of which is incorporated herein by reference.

BACKGROUND

The present inventive concept relates to a light emitting device package and a lighting apparatus including the same.

Printed circuit boards (PCB) used in the mounting of electronic devices may connect various electronic devices to one another according to a predetermined form and are widely used in electronic products ranging from home appliances, including digital televisions (TVs), to high-tech communications devices. When electronic devices, such as light emitting devices and the like, are mounted on a PCB by bonding the electronic devices to the PCB, for example by soldering, the electronic devices may be unevenly bonded or may be misaligned, for example, by rotation, and reliability and stability of the electronic devices may be hindered by those defects.

SUMMARY

Aspect of the present inventive concept may provide solutions for improving reliability and stability when electronic devices are bonded to a substrate.

According to an aspect of the present inventive concept, a light emitting device package may include a printed circuit board and a plurality of light emitting devices mounted on the printed circuit board, wherein a first light emitting device of the plurality of light emitting devices comprises first to fourth conductor pads formed discretely on the bottom surface of the light emitting device, the printed circuit board comprises first to fourth conductor patterns formed discretely on the top surface of the printed circuit board, and the first to fourth conductor patterns are connected to respective first to fourth conductor pads by respective first to fourth solders, wherein all of the first to fourth conductor patterns are not electrically connected to each other with respect to electrical connections of the printed circuit board, wherein at least two of the first to fourth conductor patterns are electrically connected by an electrical connection of the first light emitting device between at least two of the first to fourth conductor pads.

According to an embodiment of this disclosure, a light emitting device package includes a printed circuit board including first to fourth conductor patterns and a semiconductor chip mounted on the printed circuit board, wherein the semiconductor chip comprises first to fourth conductor pads formed on the bottom of the semiconductor chip, wherein the first to fourth conductor patterns are connected to respective first to fourth conductor pads by respective first to fourth solders, wherein the semiconductor chip includes at least a first light emitting diode that is configured to emit light upon receiving at least two voltages input respectively through the first and fourth conductor patterns via the first and fourth conductor pads, and wherein the first conductor pad is configured to output one of the at least two voltages when the at least one light emitting diode is emitting light.

According to an embodiment of this disclosure, a lighting apparatus includes a light emitting device package, a base on which the light emitting device package is mounted, and a cover covering the light emitting device package, wherein the light emitting device package includes a printed circuit board including first to fourth discrete conductor patterns, first light emitting device mounted on the printed circuit board, the first light emitting device comprising first to fourth discrete conductor pads formed on the bottom of the first light emitting device, and first to fourth solders connecting the first to fourth discrete conductor patterns to respective first to fourth discrete conductor pads, wherein all of the first to fourth conductor discrete patterns are not electrically connected to each other with respect to electrical connections of the printed circuit board, wherein at least two of the first to fourth discrete conductor patterns are electrically connected by an electrical connection of the first light emitting device between at least two of the discrete first to fourth conductor pads.

BRIEF DESCRIPTION OF DRAWINGS

The above and other aspects, features and advantages of the present inventive concept will be more clearly understood from the following detailed description taken in conjunction with the accompanying drawings, in which.

DETAILED DESCRIPTION

Figure 1:
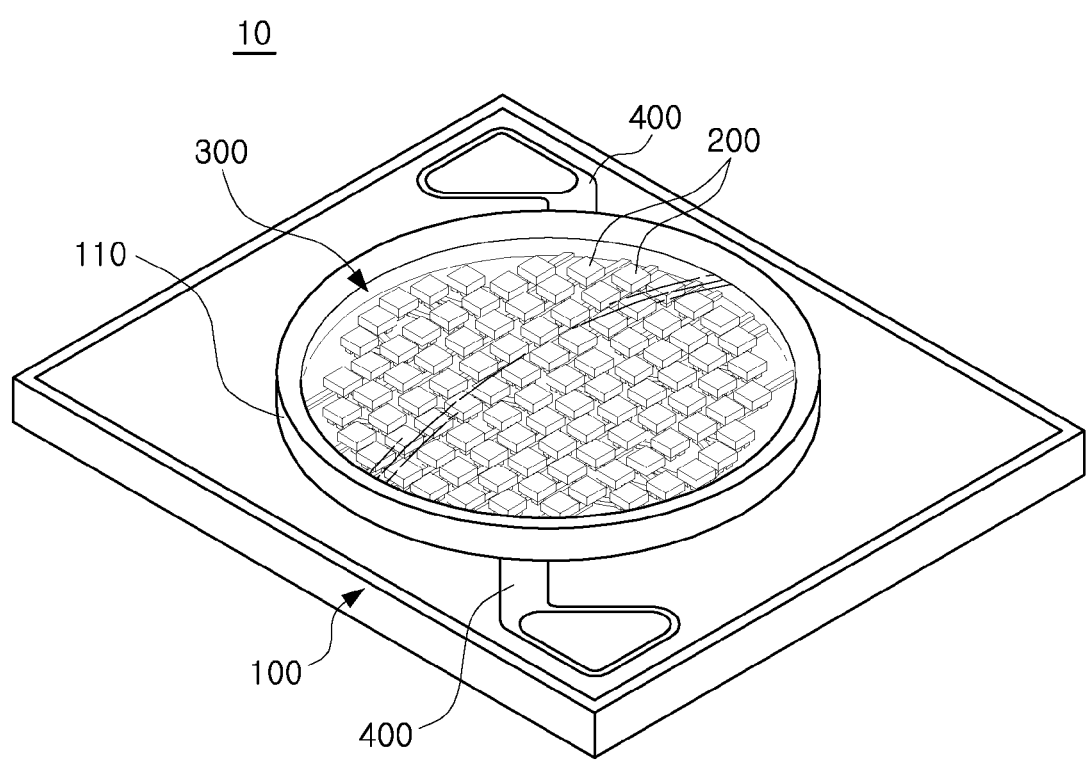
FIG. 1 is a perspective view schematically illustrating a light emitting device package according to an example embodiment of the present inventive concept.

Hereinafter, embodiments of the present inventive concept will be described as follows with reference to the attached drawings.

The present inventive concept may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the example embodiments.

Spatially relative terms, such as "above," "upper," "below," and "lower" and the like, may be used herein for ease of description to describe one element's relationship to another element (s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present inventive concept will be described with reference to schematic views illustrating embodiments of the present inventive concept. In the drawings, for example, due to manufacturing techniques and/or tolerances, modifications of the shape shown may be estimated. Thus, embodiments of the present inventive concept should not be construed as being limited to the particular shapes of regions shown herein, for example, to include a change in shape results in manufacturing. The following embodiments may also be constituted by one embodiment only, or a combination thereof.

The contents of the present inventive concept described below may have a variety of configurations and propose only a required configuration herein, but are not limited thereto.

Figure 2:
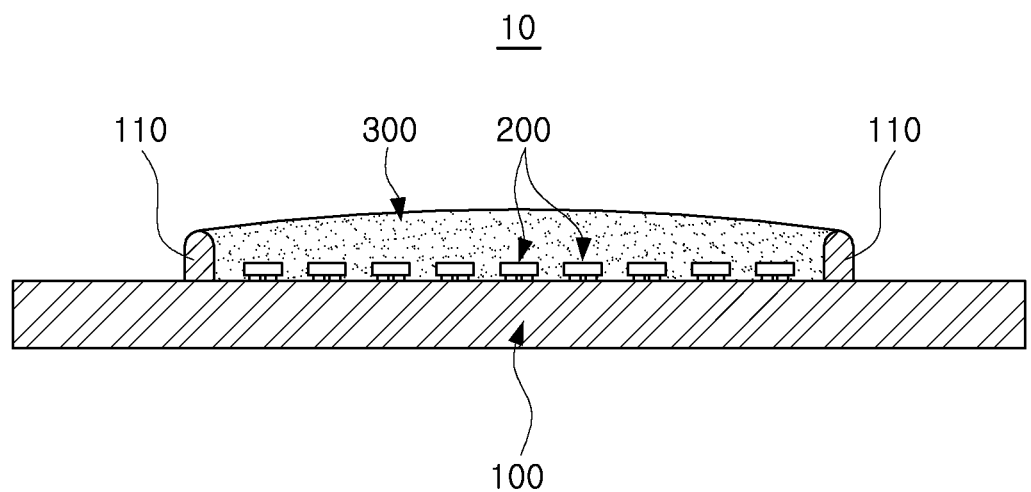
FIG. 2 is a cross-sectional view of FIG. 1.

Alight emitting device package according to an example embodiment of the present inventive concept will be described with reference to FIG. 1 and FIG. 2. FIG. 1 is a perspective view schematically illustrating a light emitting device package according to an example embodiment of the present inventive concept. FIG. 2 is a cross-sectional view of the light emitting device package illustrated in FIG. 1, taken along the center thereof.

Referring to FIG. 1 and FIG. 2, a light emitting device package 10 according to an example embodiment of the present inventive concept may include a body part 100 and a plurality of light emitting devices 200 mounted on the body part 100. The light emitting device package 10 may further include an encapsulating part 300 covering the plurality of light emitting devices 200.

Each of the light emitting devices 200 may be an optoelectronic device generating light having a predetermined wavelength through externally applied driving power. The light emitting device 200 may include, for example, a semiconductor light emitting diode (LED) having an n-type semiconductor layer and a p-type semiconductor layer, and an active layer interposed therebetween.

The light emitting devices 200 may emit blue light, green light, red light, white light, ultraviolet light or the like according to a material contained therein (or a combination thereof with a phosphor).

The light emitting devices 200 may be variously configured. For example, the light emitting devices 200 may be configured with the same type of light emitting devices generating light having the same wavelength, or the light emitting devices 200 may be configured with different types of light emitting devices generating light having different wavelengths. The light emitting devices 200 may be variously configured depending on a level of power, such as 0.5 W and 1 W. For example, the light emitting devices 200 may be configured according to target powers consumed by the light emitting device package 10.

Figure 3:
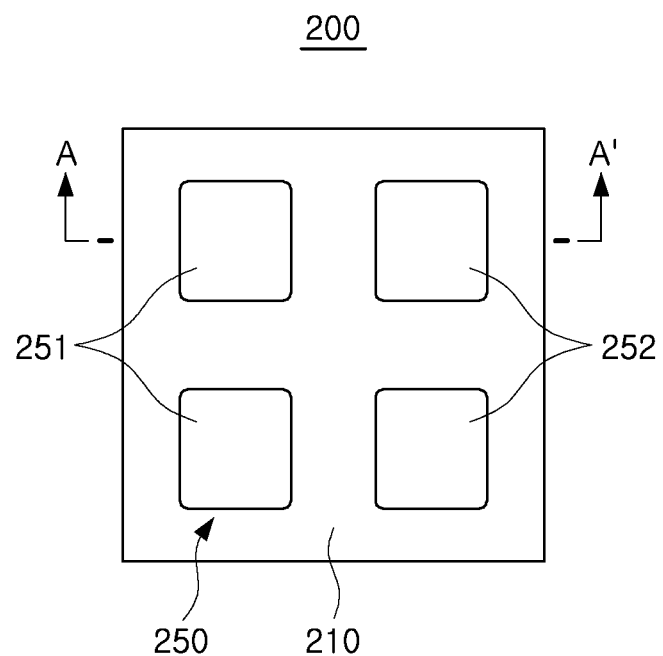
FIG. 3 is a bottom view schematically illustrating a light emitting device in the light emitting device package of FIG. 1.
Figure 4:
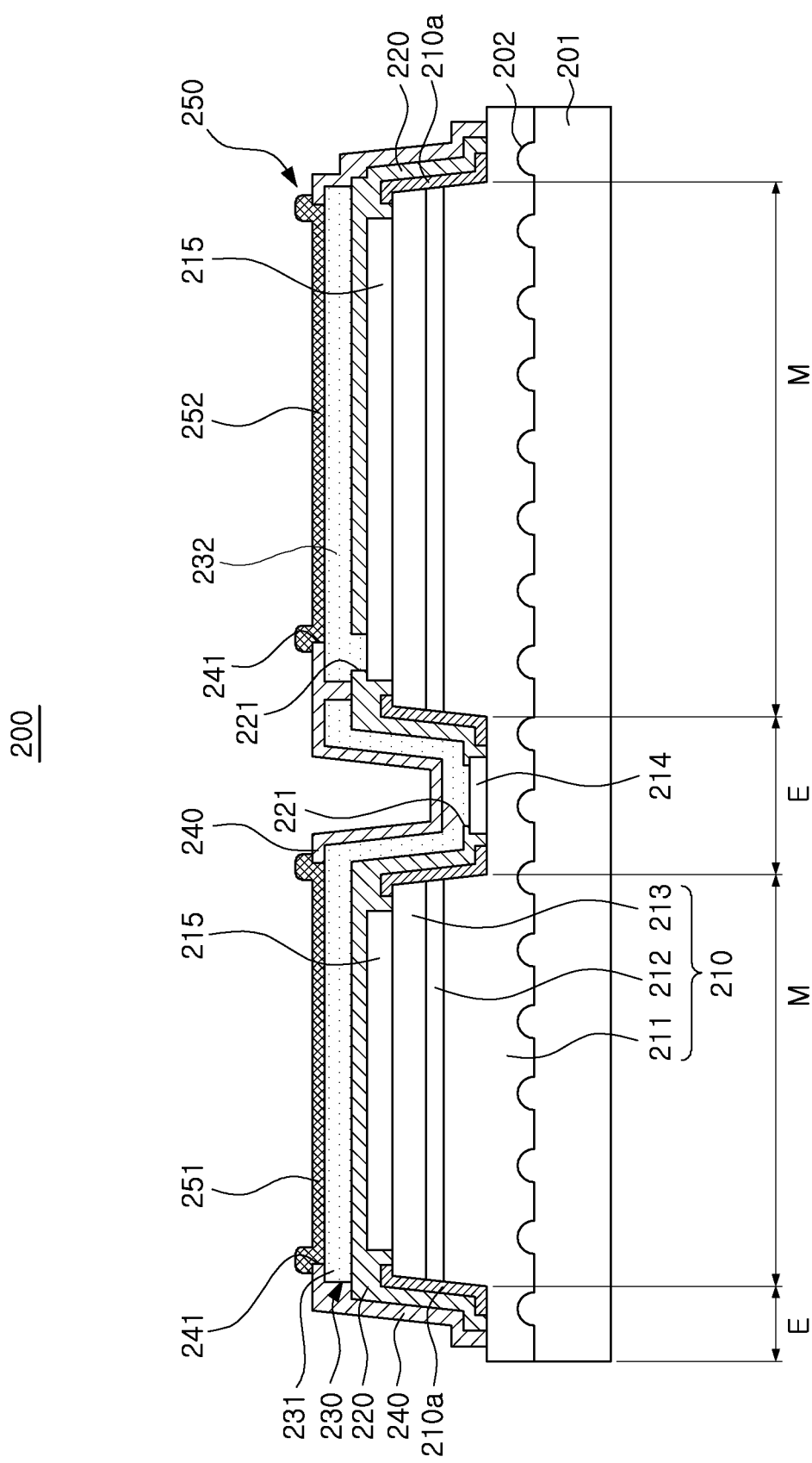
FIG. 4 is a cross-sectional view of the light emitting device of FIG. 3, taken along line A-A'.

FIG. 3 and FIG. 4 schematically illustrate the light emitting device 200. FIG. 3 is a bottom view schematically illustrating a light emitting device in the light emitting device package of FIG. 1. FIG. 4 is a cross-sectional view of the light emitting device of FIG. 3, taken along line A-A'.

As illustrated in FIG. 3 and FIG. 4, the light emitting device 200 may have a generally quadrangular structure when viewed from the bottom thereof. A plurality of solder pads 250 may be formed and exposed on a bottom surface of the light emitting device 200. The solder pads 250 may be formed as a patterned conductor. For example, the solder pads 250 may be conductor pads formed of a metal. For example, the solder pads 250 may include a material containing one or more of Au, Al, W, Pt, Ag, Cu, Ni, Ti, Cr and the like, and alloys thereof. The solder pads 250 may be used to connect the light emitting device 200 to a printed circuit board by soldering.

A shape of the light emitting device 200 is not limited to the quadrangular shape and for example, the light emitting device 200 may have a shape such as a circular shape, an oval shape, a triangular shape, a hexagonal shape, or a polygonal shape.

The light emitting device 200 may include a light emitting structure 210, a first insulating layer 220, an electrode layer 230, a second insulating layer 240, and the solder pads 250.

The light emitting structure 210 may have a structure in which a plurality of semiconductor layers are stacked, and may include a first conductivity-type semiconductor layer 211, an active layer 212, and a second conductivity-type semiconductor layer 213 sequentially stacked on a substrate 201. The substrate 201 may be a growth substrate, for example, an epitaxial growth substrate. For example, the substrate may be configured to grow an epitaxial layer on the substrate 201.

The substrate 201 may be provided as a substrate for semiconductor growth and may be formed by using an insulating material, a conductive material or a semiconductor material such as sapphire, Si, SiC, $MgAl_2O_4$, MgO, $LiAlO_2$, $LiGaO_2$, GaN or the like.

A plurality of uneven structures 202 may be formed on an upper surface of the substrate 201, for example, on a surface on which the semiconductor layers are grown. The uneven structures 202 may be beneficial to crystal properties and light emission efficiency of the semiconductor layers. The example embodiment illustrates a case in which the uneven structures 202 are convexly formed, such as having dome shapes, but the present inventive concept is not limited thereto. For example, the uneven structures 202 may be formed to have various shapes such as a quadrangular shape, a triangular shape and the like. The uneven structures 202 may be selectively formed and provided. For example, uneven structures 202 may be formed in a predetermined area of the substrate 201, and thus, may be omitted in certain areas or the whole areas of the substrate 201.

The substrate 201 may be removed later according to an embodiment. For example, after the substrate 201 is provided for growing the first conductivity-type semiconductor layer 211, the active layer 212, and the second conductivity-type semiconductor layer 213 thereon, the substrate 201 may be removed through a separation process. The substrate 201 may be separated from the semiconductor layers through a process such as a laser lift-off (LLO) process, a chemical lift-off (CLO) process or the like.

The first conductivity-type semiconductor layer 211 stacked on the substrate 201 may be formed of a semiconductor doped with an n-type impurity and may be an n-type nitride semiconductor layer. The second conductivity-type semiconductor layer 213 may be formed of a semiconductor doped with a p-type impurity and may be a p-type nitride semiconductor layer. However, according to an embodiment, the first conductivity-type semiconductor layer 211 and second conductivity-type semiconductor layer 213 may be stacked such that positions thereof are interchanged. For example, in certain embodiments, the first conductivity-type semiconductor layer 211 may be a p-type semiconductor and the second conductivity-type semiconductor layer 212 may be an n-type semiconductor. The first conductivity-type semiconductor layer 211 and second conductivity-type semiconductor layer 213 may have a compositional formula of $Al_xIn_yGa_{(1-x-y)}N$ (where, $0 \leq x < 1$, $0 \leq y < 1$, $0 \leq x+y < 1$) and materials having such a compositional formula may be, for example, GaN, AlGaN, InGaN, AlInGaN, and the like.

The active layer 212 interposed between the first conductivity-type semiconductor layer 211 and second conductivity-type semiconductor layer 213 may emit light having predetermined energy due to the recombination of electrons and holes. The active layer 212 may contain a material having an energy band gap smaller than those of the first conductivity-type semiconductor layer 211 and second conductivity-type semiconductor layer 213. For example, when the first conductivity-type semiconductor layer 211 and second conductivity-type semiconductor layer 213 are GaN-based compound semiconductors, the active layer 212 may contain an InGaN-based compound semiconductor having an energy band gap smaller than that of GaN. The active layer 212 may have a multiple quantum well (MQW) structure in which quantum well and quantum barrier layers are alternately stacked, for example, a structure of InGaN/GaN. However, since the structure of the active layer 212 is not limited thereto, the active layer 212 may also have a single-quantum well (SQW) structure.

The light emitting structure 210 may include an etched region E in which the second conductivity-type semiconductor layer 213, the active layer 212, and the first conductivity-type semiconductor layer 211 are partially etched, and a plurality of mesa regions M partially divided by the etched region E. For example, the light emitting structure 210 may be patterned by etching out a portion of the light emitting structure 210. For example, portions of the second conductivity-type semiconductor layer 213, the active layer 212, and the first conductivity-type semiconductor layer 211 may be removed to form one or more trenches in the etched region E. For example, a single trench may be formed to define the etched region E to extend between two opposite sides of the light emitting device 200, two mesa regions M (e.g., square or rectangular from a top down perspective) may be formed. As another example, two trenches may be formed (only one of which is shown in FIG. 4) to define the etched region E, each extending between a different pair of opposite sides of the light emitting device, thereby obtaining for mesa regions M (e.g., square or rectangular from a top down perspective). A portion of the first conductivity-type semiconductor layer 211 may remain at the bottom of the trench. For example, the first conductivity-type semiconductor layer 211 may be exposed at the bottom of the trench in the etched region E. Remaining portions of the second conductivity-type semiconductor layer 213 and the active layer 212 may form mesa regions M. For example, the mesa regions M may be divided by the trench.

A first contact electrode 214 may be disposed on an upper surface of the first conductivity-type semiconductor layer 211 exposed to the etched region E and may be connected to the first conductivity-type semiconductor layer 211, and a second contact electrode 215 may be disposed on an upper surface of each of the plurality of mesa regions M and may be connected to the second conductivity-type semiconductor layer 213.

A passivation layer 210a formed of an insulating material may be provided on a side surface of the mesa region M so as to cover the active layer 212 exposed to the etched region E. However, the passivation layer 210a may be omitted according to certain embodiments. For example, in certain embodiments, the side surface of the mesa region M may be covered by an insulating layer, and the side surface of the mesa region M may contact to a subsequently formed insulating layer, for example, the first insulating layer 220.

The first insulating layer 220 may be provided on the light emitting structure 210 so as to entirely cover the light emitting structure 210. The first insulating layer 220 may be basically formed of a material having insulating characteristics and may be formed of an organic or inorganic material. For example, the first insulating layer 220 may be formed of an epoxy-based insulating resin. For example, the first insulating layer 220 may be formed to contain a silicon oxide or silicon nitride and for example, may be formed of $SiO_2$, $SiO_xN_y$, $TiO_2$, $Si_3N_4$, $Al_2O_3$, TiN, AlN, $ZrO_2$, TiAlN, TiSiN or the like.

The first insulating layer 220 may have a plurality of first openings 221 disposed on the respective first conductivity-type semiconductor layer 211 and second conductivity-type semiconductor layer 213. For example, the first openings 221 disposed on the first conductivity-type semiconductor layer 211 may partially expose the first contact electrode 214, and the first openings 221 disposed on the second conductivity-type semiconductor layer 213 may partially expose the second contact electrode 215.

The electrode layer 230 may be provided on the first insulating layer 220 and may be electrically connected to the first conductivity-type semiconductor layer 211 and the second conductivity-type semiconductor layer 213 through the respective first openings 221. In certain embodiments, the electrode layer 230 and the solder pads 251 connected thereto of two (or more) mesas M may form a single electrical node. A power supply voltage (e.g., Vdd or Vss) supplied from an external source to one of the electrode layer 230 and solder pad 251 connected pair of a first mesa M may be transmitted by internal wiring (e.g., by electrode layer 230) to the other electrode layer 230 and solder pad 251 connected pair of a second mesa M and output from the light emitting device 200. For example, two or more mesas M may have the structure and/or electrical connections (e.g., of second contact electrode 215 and electrode layer 230) as shown by the mesa M on the left side of FIG. 4, or two or more mesas M may have the structure (e.g., of second contact electrode 215 and electrode layer 230) as shown by the mesa M on the rights side of FIG. 4.

The electrode layer 230 may be insulated from the first conductivity-type semiconductor layer 211 and the second conductivity-type semiconductor layer 213 by the first insulating layer 220 entirely covering an upper surface of the light emitting structure 210, and may be connected to the first contact electrode 214 and the second contact electrode 215 outwardly exposed through the respective first openings 221 to be connected to the first conductivity-type semiconductor layer 211 and the second conductivity-type semiconductor layer 213 respectively.

The electrical connection between the electrode layer 230 and the first conductivity-type semiconductor layer 211 and the second conductivity-type semiconductor layer 213 may be variously adjusted by the first openings 221 provided in the first insulating layer 220. For example, depending on the number and arrangement positions of the first openings 221, the electrical connection between the electrode layer 230 and the first conductivity-type semiconductor layer 211 and the second conductivity-type semiconductor layer 213 may be variously modified.

The electrode layer 230 may be provided as at least one pair of electrode layers for electrical insulation between the first conductivity-type semiconductor layer 211 and the second conductivity-type semiconductor layer 213. For example, a first electrode layer 231 may be electrically connected to the first conductivity-type semiconductor layer 211 and a second electrode layer 232 may be electrically connected to the second conductivity-type semiconductor layer 213. The first and second electrode layers 231 and 232 may be separated and electrically insulated from each other.

The electrode layer 230 may be formed of a material containing one or more of Au, Al, W, Pt, Si, Ir, Ag, Cu, Ni, Ti, Cr and the like, and alloys thereof.

The second insulating layer 240 may be provided on the electrode layer 230 and may entirely cover and protect the electrode layer 230. The second insulating layer 240 may have a second opening 241 partially exposing the electrode layer 230. The second opening 241 may be provided in plural in order to partially expose the first electrode layer 231 and the second electrode layer 232.

The second insulating layer 240 may be formed of the same material as that of the first insulating layer 220.

The solder pads 250 may include a first solder pad 251 and a second solder pad 252 and may be respectively provided on the first and second electrode layers 231 and 232 partially exposed through the second openings 241. In addition, the first solder pad 251 and the second solder pad 252 maybe electrically connected to the first conductivity-type semiconductor layer 211 and the second conductivity-type semiconductor layer 213, respectively, through the electrode layer 230. Each of the first solder pad 251 and the second solder pad 252 may be provided in plural.

In order to implement a chip-on-board (COB) type structure using a flip chip bonding scheme, the first solder pad 251 and the second solder pad 252 may be disposed in the same direction with respect to the light emitting structure 210. The light emitting structures 210 may each comprise one or more light emitting diodes. For example, a first conductivity-type semiconductor layer 211, an active layer 212, and a second conductivity-type semiconductor layer 213 of a mesa M may form a light emitting diode.

As illustrated in FIG. 3, two first solder pads 251 and two second solder pads 252 may be disposed to be symmetrical to each other. For example, each of the first solder pads 251 and second solder pads 252 may overlap a respective light emitting diode. The number of the first solder pad 251 and the second solder pad 252 may be variously changed. For example, three first solder pads 251 and three second solder pads 252 may be disposed to be symmetrical to each other so that six light emitting diodes may be formed in a light emitting device 200.

The plurality of light emitting devices 200 may be fixedly mounted on the body part 100 and electrically connected thereto.

The body part 100 may support the plurality of light emitting devices 200 disposed on an upper surface thereof. The body part 100 may have an electrode pattern 400 electrically connected to the plurality of light emitting devices 200 and may be connected to an external power source in order to drive the plurality of light emitting devices 200. The electrode pattern 400 may be provided to apply power to the plurality of light emitting devices 200 mounted on the body part 100 and may be provided in a form of a conductive thin film (for example copper foil).

The body part 100 may be, for example, a metal printed circuit board (PCB). The body part 100 may be formed of a ceramic material, an organic resin material containing epoxy, triazine, silicon, polyimide and the like, or other organic resin materials.

The body part 100 may have a dam portion 110 surrounding the plurality of light emitting devices. The dam portion 110 may be formed to protrude upwardly from the upper surface of the body part 100. The dam portion 110 may have a ring-shaped structure, and an internal space surrounded by the dam portion 110 may define a light emitting region. The plurality of light emitting devices 200 may be disposed in the internal space.

The embodiment exemplifies a case in which the dam portion 110 has a circular ring shape, but the present inventive concept is not limited thereto. For example, the dam portion 110 may have a quadrangular ring shape. For example, the dam portion 110 may be oval, square, rectangular, diagonal, or curved.

Figure 5:
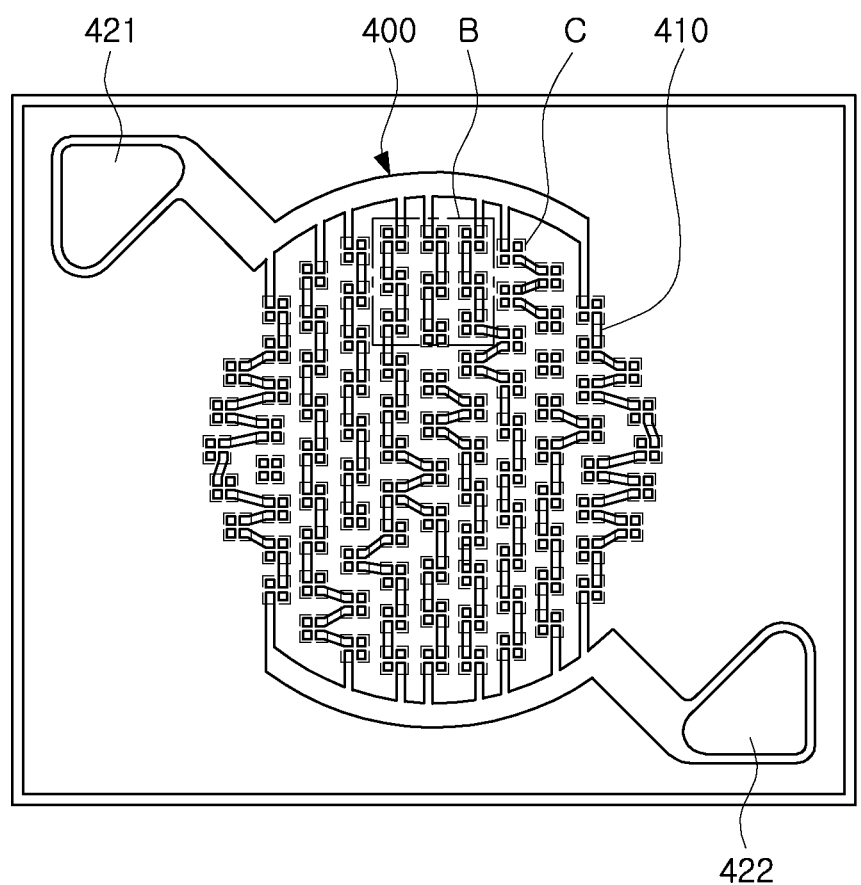
FIG. 5 is a plan view schematically illustrating an electrode pattern formed on a body part.
Figure 6:
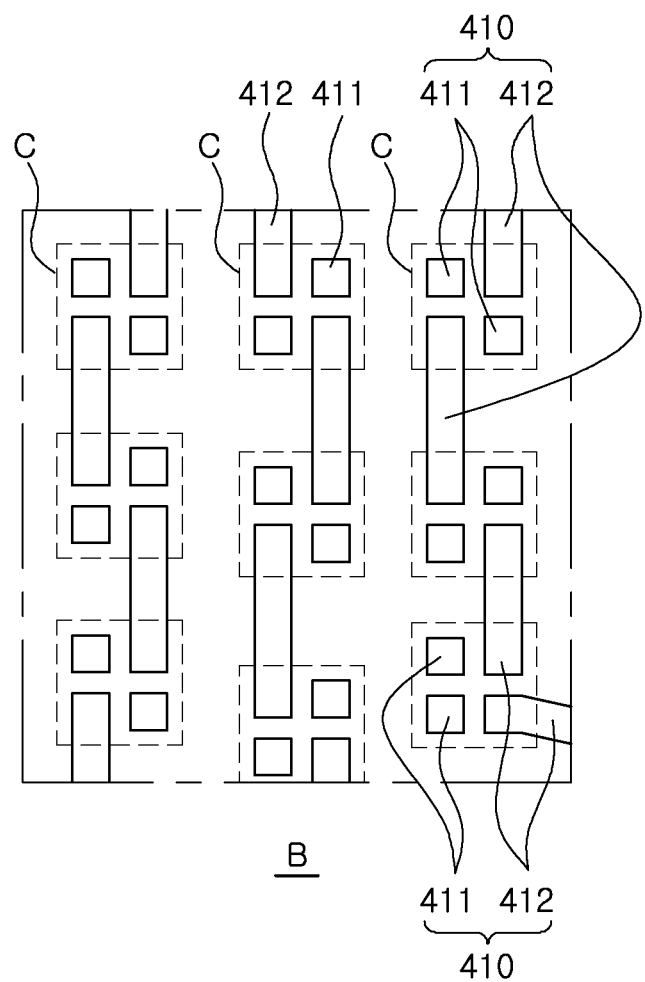
FIG. 6 is an enlarged plan view of portion "B" from FIG. 5.

FIG. 5 and FIG. 6 schematically illustrate the electrode pattern 400. FIG. 5 is a plan view schematically illustrating the electrode pattern formed on the body part. FIG. 6 is an enlarged plan view of portion "B" of FIG. 5.

As illustrated in FIG. 5 and FIG. 6, the electrode pattern 400 may have a plurality of cells C defining mounting regions in which the respective light emitting devices 200 are disposed. For example, the respective cells C may define the mounting regions in which the respective light emitting devices 200 are disposed, and the cells C may have shapes substantially corresponding to the light emitting devices 200.

The embodiment indicates the cells C with broken line regions. However, broken lines indicating the cells C may be provided to help understanding of the embodiment and may be omitted in certain embodiments.

Each of the cells C may have electrode pads 410 corresponding to the solder pads 250. For example, a plurality of electrode pads 410 may be spaced apart from each other and may be arranged to face the solder pads 250 within each cell C. The electrode pads 410 may be disposed on the cells C to overlap the entirety of the respective solder pads 250 in such a manner that they have an area enlarged at a predetermined ratio as compared to the solder pads 250. The electrode pads 410 may have a shape substantially identical to or enlarged at a predetermined ratio as compared to the solder pads 250.

At least one of the plurality of electrode pads 410 may be extended outwardly of the corresponding cell C and may be connected to the electrode pads 410 of adjacent cells C.

The electrode pad 410 may include a first electrode pad 411 and a second electrode pad 412 having a length greater than that of the first electrode pad 411. The first electrode pad 411 may be disposed within each cell C, and the second electrode pad 412 may be extended outwardly from the cell C and may extend to an adjacent cell C. For example, the second electrode pad 412 may extend between a pair of the cells C adjacent to each other and may be partially disposed within each of the pair of cells C. The second electrode pad 412 may extend at various angles between a pair of adjacent cells C.

The embodiment exemplifies a case in which one pair of first electrode pads 411 and one pair of second electrode pads 412 are disposed within each cell C, but the present inventive concept is not limited thereto.

Figure 7A:
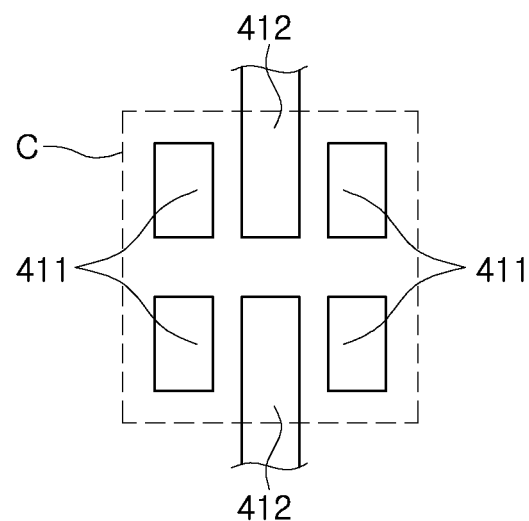
FIG. 7A and FIG. 7B are plan views schematically illustrating modified examples of the electrode pattern.
Figure 7B:
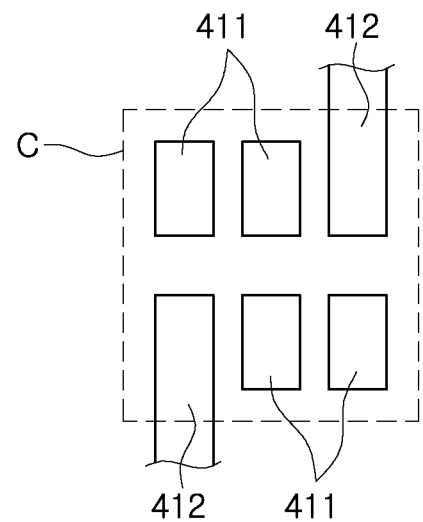

FIG. 7A and FIG. 7B schematically illustrate modified examples of the cell. As illustrated in FIG. 7A and FIG. 7B, four first electrode pads 411 and two second electrode pads 412 are disposed within the cell C. In this case, positions of the second electrode pads 412 may be variously modified. For example, two different arrangements of the second electrode pads 412 are shown in FIGS. 7A and 7B.

The light emitting device in FIG. 3 may include four light emitting diodes 210. FIG. 4 shows that two light emitting diodes 210 have their first conductivity type semiconductor layer 211 connected in common by the first contact electrode 214. The second conductivity type semiconductor layers 213 of FIG. 4 may be electrically connected to each other (not shown) or may be separately connected to different electrical nodes (that may be connected to different solder pads). The other two light emitting diodes in FIG. 3 may also be electrically connected in a similar manner. In some examples, electrodes of two or more of the light emitting diodes 210 may be electrically connected to each other in series.

In certain embodiments, the light emitting devices 200 may be semiconductor chips. In certain embodiments, all four light emitting diodes in FIG. 3 may be electrically connected in series. In this case, one of the first conductivity type semiconductor layers 211 may be electrically connected to one of the second electrode pads 412 in a cell C of FIG. 6 by soldering between corresponding solder pad and electrode pad. One of the second conductivity type semiconductor layers 211 may be electrically connected to the other second electrode pad 412 in the cell C by soldering between corresponding solder pad and electrode pad. The first contact electrode 214 may electrically connect the one of the first conductivity type semiconductor layer 211 to the one of the second electrode pads 312, and may be insulated from the other first conductivity type semiconductor layers 211. In this case, the first electrode pads 411 in a cell C may be electrically connected by a conductive pattern. This conductive pattern may be buried under the top surface of the body part 100.

In certain embodiments, the four light emitting diodes of FIG. 3 may be electrically connected in parallel. In this case, the first contact electrode 214 may be electrically connected to all four first conductivity type semiconductor layers 211. The second conductivity type semiconductor layers 213 may be electrically connected to each other. In certain embodiments, the connecting material between the second conductivity type semiconductor layers 213 may be the second conductivity type semiconductor layer 213 itself, thereby forming a single light emitting diode in the whole area of the light emitting device of FIG. 3.

Figure 8:
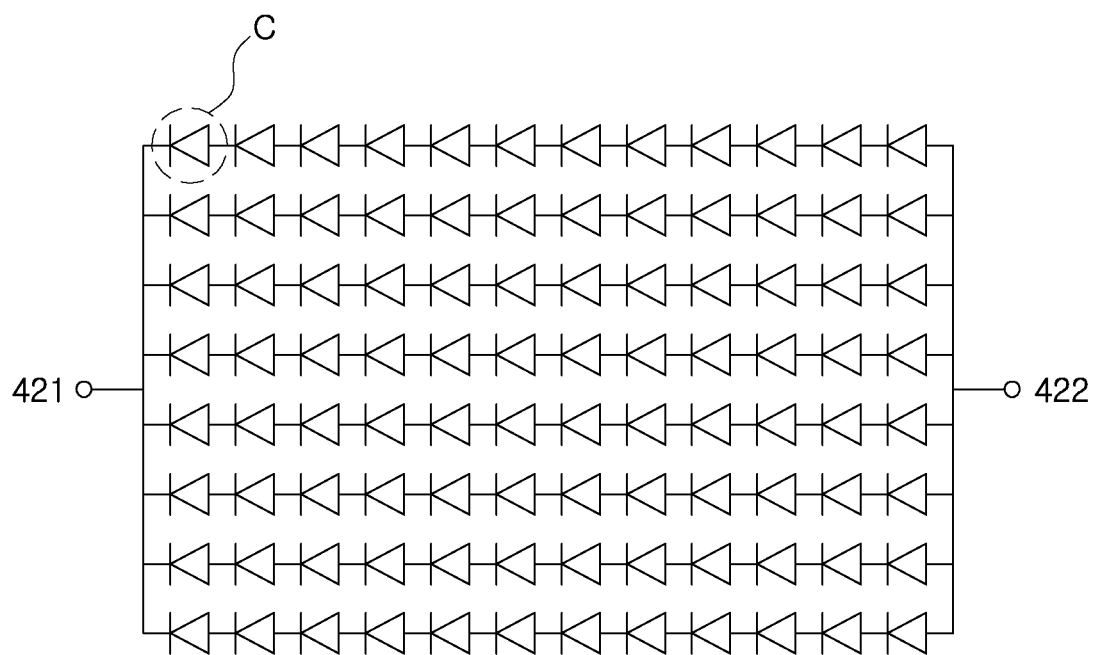
FIG. 8 is an equivalent circuit diagram of a cell in the electrode pattern of FIG. 5.

As illustrated in FIG. 5, the plurality of arranged cells C may be connected to one another in series and/or in parallel. For example, in order to implement uniform light emission distribution, the plurality of cells C may have a structure in which a plurality of series strings formed by connecting the same number of elements to one another in series may be connected to one another in parallel, as in an equivalent circuit illustrated in FIG. 8. For example, it may be beneficial to connect the same number of cells C in each of the series strings of cells C. For example, in certain embodiments, it is beneficial to form a light emitting package having uniform luminance throughout the whole light emitting area. An example of this is shown in FIG. 8. In FIG. 8, the cells C are connected in series to form cell strings. Here, the cell strings include the same number of cells C. The cell strings are connected to one another in parallel.

The embodiment exemplifies a circuit pattern having a structure in which eight series strings (or cell strings) are connected to one another in parallel, each cell string of which includes twelve cells C connected in series. The number of the series strings and the number of the cells C configuring each series string may be variously changed, and are not limited to this embodiment.

In this manner, the plurality of cells C are evenly or uniformly connected to one another in series and in parallel, whereby uniform light emission distribution is accomplished over the overall light emission region in which the plurality of cells C are arranged. In certain embodiments, the arrangement of the plurality of cells C may be variously adjusted by connecting the second electrode pads 412 from one cell C to another cell C adjacent to the one cell C, whereby various forms of lighting may be realized.

The number of the plurality of cells C may correspond to the number of the light emitting devices 200 mounted on the body part 100. In certain embodiments, the number of the plurality of cells C may be greater than the number of the light emitting devices 200 mounted on the body part 100, In this case, the light emitting devices 200 may be selectively mounted on the cells C disposed in necessary positions.

Meanwhile, the electrode pattern 400 may have connection terminals 421 and 422 exposed outwardly from a surface of the body part 100 and connected to an external power source. The connection terminals 421 and 422 may be provided as at least one pair of connection terminals having different polarities.

The plurality of light emitting devices 200 may be mounted on the body part 100 by solder bumps 500 interposed between the solder pads 250 and the electrode pads 410 and may be electrically connected to the electrode pads 410.

Figure 9:
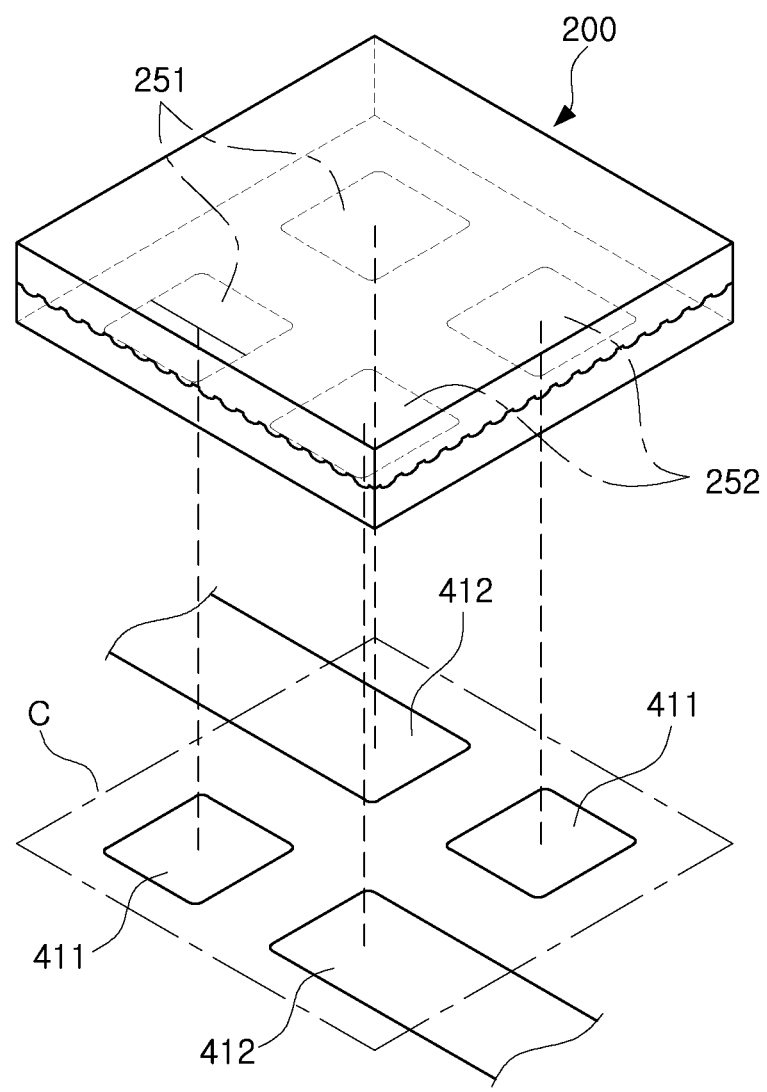
FIG. 9 through FIG. 11 are views illustrating a process of mounting a light emitting device on a body part.
Figure 10:
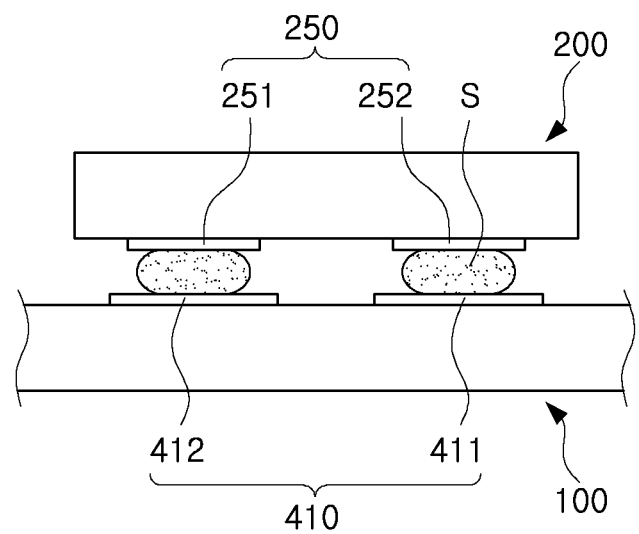
Figure 11:
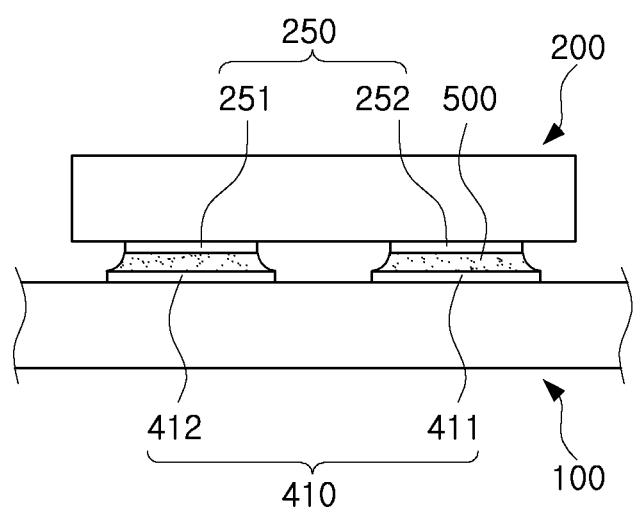

With reference to FIG. 9 through FIG. 11, a process of mounting the light emitting device on the body part will be described.

As illustrated in FIG. 9, the light emitting device 200 may be disposed such that the solder pads 250 face the electrode pads 410 of the cell C. For example, as illustrated in FIG. 10, the light emitting device 200 may be mounted on the body part 100 through solder balls S interposed between the solder pads 250 and the electrode pads 410.

Then, using a reflow process, the solder balls S may be melted by applying heat thereto to form solder bumps 500, whereby the light emitting device 200 may be adhered to the body part 100. FIG. 11 schematically illustrates a state in which the reflow process has been completed and thus, the light emitting device 200 is attached to the body part 100 by the solder bumps 500.

In the process, the solder balls S melted by the reflow process may have properties that the solder balls S are well adhered to a metal due to wettability property thereof. For example, after the solder balls S are melted, the liquid of the solder balls spread out to an outer circumferential portion of the solder pad 250 and an outer circumferential portion of the electrode pad 410. Then, the flow of the melted solder balls S may be stopped at the circumferential portion of the solder pad 250 and/or the circumferential portion of the electrode pad 410. For example, the melted solder balls S may not overflow beyond the outer circumferential portion of the electrode pad 410 due to surface tension and may be fixedly maintained along the outer circumferential portion of the electrode pad 410. Subsequently, the melted solder balls S may be solidified again to form solder bumps 500. By the solder bumps 500 hardened in such a fixed state, the light emitting devices 200 may be attached to the body part 100 in a COB scheme.

According to this embodiment, the electrode pads 410 within the cell C may have four separate structures and may be arranged to face the solder pads 250 of the light emitting device 200, thereby preventing the liquid of the solder balls Smelted during the reflow process from flowing and resulting in an undesirable concentrated amount in one region. Two or more of the electrode pads 410 may be part of the same electrical node by virtue of an electrical connection of (with may be within) the light emitting device 200. For example, the melted solder balls S may be dispersedly disposed in four divided regions and may be uniformly distributed over the bottom surface of the light emitting device 200. With respect to a top down view, the melted solder balls S may be formed in a point symmetric arrangement with respect to the center of the light emitting device. Thus, the light emitting device 200 may be bonded while being maintained in a horizontal state.

The electrode pads 410 within the cell C may have outer boundaries that align with (which may perfectly vertically aligned or slightly offset with respect to a vertical direction) from boundaries of the solder pads 250 to which they are connected. For example, when the solder pads 250 are formed in the shape of a square, the electrode pads 410 may be formed in the shape of a square of the same size or slightly larger (as shown with respect to electrode pads 411) or slightly smaller where corresponding edges of solder pads 250 and electrode pads 410 extend in the same direction. A majority of the boundaries of the electrode pads 411 may be aligned, such as three of the four boundaries of electrode pad 412 being aligned with edges of solder pad 251 in FIG. 12B.

Figure 12A:
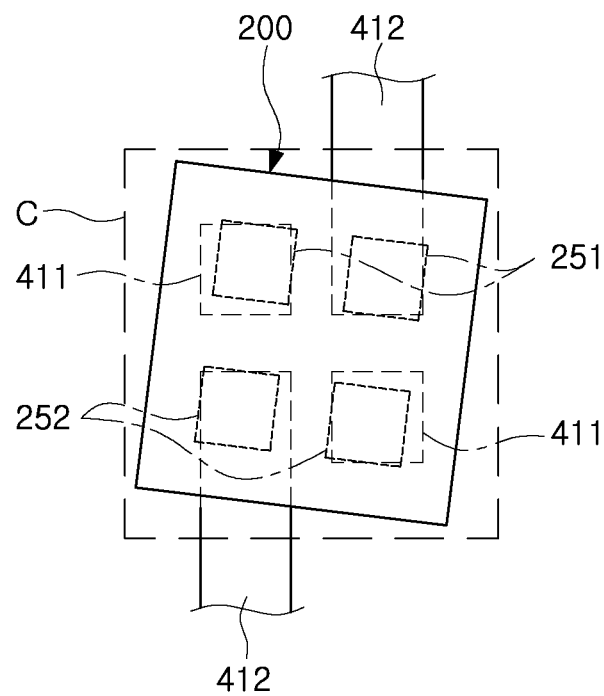
FIG. 12A and FIG. 12B are views illustrating characteristics of the light emitting device package according to an example embodiment of the present inventive concept.
Figure 12B:
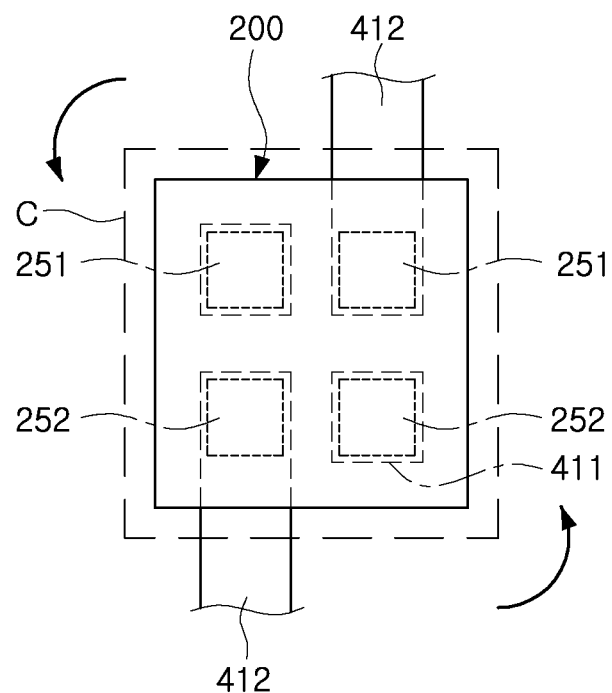

With reference to FIGS. 12A and 12B, other characteristics of the embodiment will be described.

When the light emitting device 200 is disposed on the cell C, the light emitting device 200 may be positioned to be matched with the cell C in such a manner that an overlapping area between the solder pads 250 and the electrode pads 410 may be maximized. However, as illustrated in FIG. 12A, the light emitting device 200 may also be mounted in a misaligned state due to fabrication deviations and the like.

Thereafter, the solder balls S may be melted, and the melted solder balls S may spread into spaces between the solder pads 250 and the electrode pads 410. During this spreading time, as illustrated in FIG. 12B, a mounting position of the light emitting device 200 may be self-aligned such that an overlapping area between the solder pads 250 and the electrode pads 410 may be maximized due to surface tension of the melted solder balls S.

For example, in this embodiment, the solder pads 250 and the electrode pads 410 have four separate structures, whereby misalignment defects of the light emitting device 200 may be significantly reduced due to the self-alignment of the four locations. For example, the solder pads 250 may be separated from each other, and forms isolated patterns on the bottom surface the light emitting device 200 as shown in FIGS. 3, 12A, and 12B. The electrode pads 410 may be separated from each other on the top surface of the body part 100 as shown in FIGS. 6, 7A, 7B, and 9. In these embodiments, the second electrode pads 412 extend to adjacent cells C on the top surface of the body part 100. However, the invention is not limited to these embodiments.

For example, in certain embodiments, the second electrode pads 412 may be buried under the top surface of the body part 100 at the extending portions to adjacent light emitting device. For example, a dielectric layer may be formed on the second electrode pads 412 between the cells C, so that the second electrode pads 412 may be exposed only on the cells C. For example, the first and second electrode pads 411 and 412 may have isolated patterns on the top surface of the body part 100. For example, the first and second electrode pads 411 and 412 may have isolated patterns at a top view of the body part 100.

In certain embodiments, the solder pads 250 may include dummy solder pads. The solder pads 250 including dummy solder pads may be formed of conductor patterns. The dummy solder pads may be electrically floating and may be electrically isolated from the remainder of the light emitting device 200 by a dielectric material. The dummy solder pads may be configured to be applied with neither electric power nor electronic signal during the time that the light emitting device 200 emits light. For example, one or two of the four solder pads 250 in respective FIGS. 12A and 12B may be dummy solder pads. For example, one or more, but less than 5 solder pads 250 in respective FIGS. 7A and 7B may be dummy solder pads.

In certain embodiments, the electrode pads 410 may be formed of conductor patterns. For example, the electrode pads 410 may be conductor pads. For example, the electrode pads 410 may be formed of a material containing one or more of Au, Al, W, Pt, Ag, Cu, Ni, Ti, Cr and the like, and alloys thereof.

In certain embodiments, the electrode pads 410 may include dummy electrode pads. The dummy electrode pads may be formed of conductor patterns. The dummy electrode pads may be isolated by a dielectric material. The dummy electrode pads may be configured to be applied with neither electric power nor electronic signal during the time that the light emitting device 200 emits light. For example, one or two of the four electrode pads 410 in respective FIGS. 12A and 12B may be dummy electrode pads. For example, one or more, but less than 5 electrode pads 410 in respective FIGS. 7A and 7B may be dummy solder pads.

During a time that the light emitting device 200 is applied with an electric power (e.g., Vdd or Vss), the light emitting device 200 may emit light from the active layer 212. During this time, electric charge may flow into the light emitting device 200 via one of the second electrode pads 412, and the electric charge may flow out of the light emitting device 200 via the other of the second electrode pads 412. The electric charge may flow through one or more of the first electrode pads 411. In case one or more of the first electrode pads 411 are dummy pads, the electric charge may not flow through the dummy pads.

Meanwhile, the encapsulating part 300 may fill the interior of the space defined by the dam portion 110 and may cover the plurality of light emitting devices 200.

The encapsulating part 300 may be formed of a light-transmissive material such that light generated by the plurality of light emitting devices 200 may be emitted outwardly. The light-transmissive material may be, for example, a resin such as silicon, epoxy or the like.

The encapsulating part 300 may be formed by injecting a resin onto the body part 100 and hardening the resin by a method such as heating, light irradiation, the lapse of time, or the like. The encapsulating part 300 may have an upwardly convex dome shape in order to adjust an angle of beam spreading outwardly. The encapsulating part 300 may also be formed in a flat structure in which an upper portion thereof is flat.

The encapsulating part 300 may contain a wavelength conversion material excited by light generated from the light emitting device 200 and emitting light having a different wavelength, for example, at least one phosphor, whereby the encapsulating part 300 may adjust color of light in such a manner that various colors of light may be emitted therefrom. The encapsulating part 300 may also contain a light reflective material in order to spread externally emitted light. The light reflective material may be, for example, $SiO_2$, $TiO_2$, $Al_2O_3$ or the like.

For example, when the light emitting device 200 emits blue light, the light emitting device package may emit white light by combining a yellow phosphor, a green phosphor, a red phosphor and/or an orange phosphor. In certain embodiments, the light emitting device package may be configured to include at least one of light emitting devices 200 emitting violet, blue, green, red or infrared light. In this case, the light emitting device 200 may emit light having a color rendering index (CRI) from '40' to '100', and may generate various types of white light with color temperatures ranging from about 2000K to 20000K. In certain embodiments, the light emitting device 200 may generate violet, blue, green, red or orange visible light or infrared light to be used in various circumstances, for example, according to a surrounding atmosphere and a user's selection. Also, the light emitting device 200 may generate a specific wavelength of light for accelerating the growth of plants.

Figure 13:
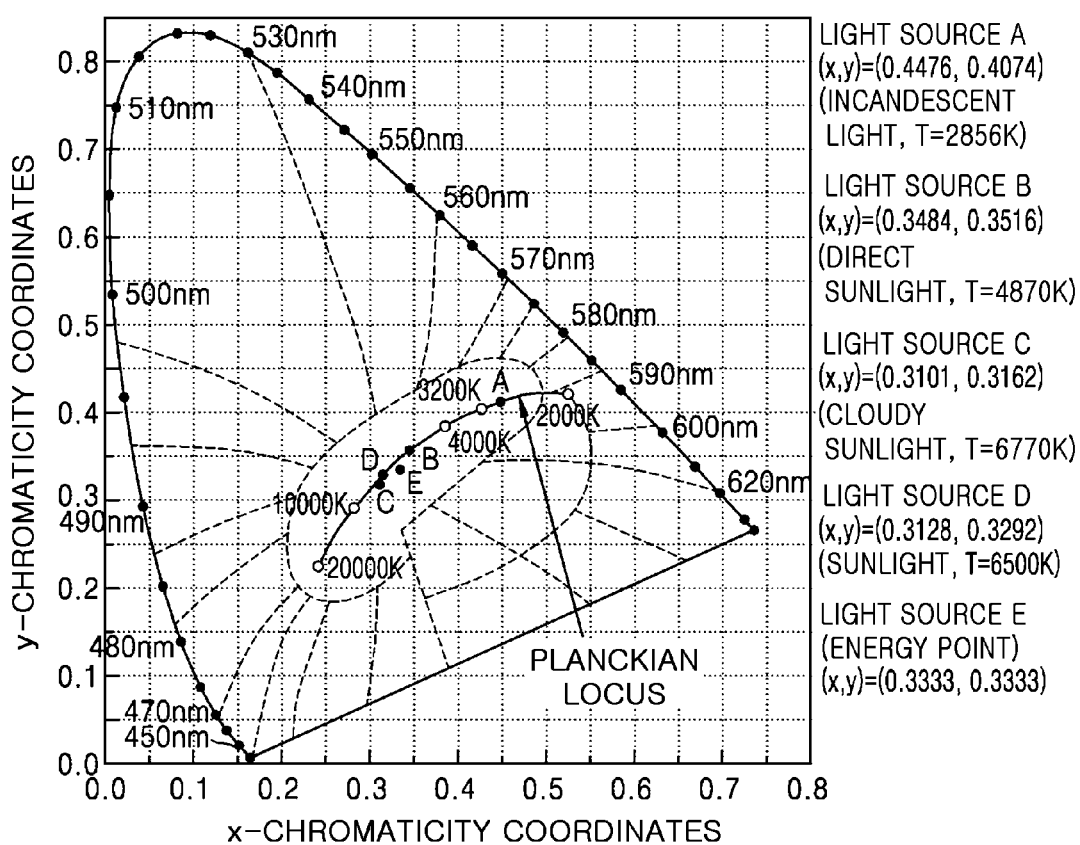
FIG. 13 is the CIE 1931 color space diagram illustrating a wavelength conversion material employable in an example embodiment of the present inventive concept.

White light formed by combining yellow, green, red phosphors with a blue light emitting device and/or combining green and red light emitting devices may have two or more peak wavelengths, and coordinates (x, y) thereof in the CIE 1931 color space of FIG. 13 may be positioned on a line segment connecting (0.4476, 0.4074), (0.3484, 0.3516), (0.3101, 0.3162), (0.3128, 0.3292), and (0.3333, 0.3333). Alternatively, coordinates (x, y) thereof in the CIE 1931 color space may be positioned in a region surrounded by the line segment and blackbody radiation spectrum. The color temperature of white light may range from about 2000K to 20000K.

In FIG. 13, white light in the vicinity of point E (0.3333, 0.3333), disposed below the blackbody radiation spectrum, may be in a state in which a level of yellow light is relatively low and may be used as a lighting source in a region exhibiting a brighter or fresh feeling. Therefore, lighting products using white light in the vicinity of point E (0.3333, 0.3333), disposed below the blackbody radiation spectrum, may be highly effective as lighting apparatuses for retail stores, for example, groceries, clothing stores and the like.

Phosphors usable in the present inventive concept may have the following composition formulae and colors.

Oxides: Yellow and green $Y_3Al_5O_{12}$:Ce, $Tb_3Al_5O_{12}$:Ce, $Lu_3Al_5O_{12}$:Ce Silicates: Yellow and green $(Ba,Sr)_2SiO_4$:Eu, yellow and orange $(Ba,Sr)_3SiO_5$:Ce Nitrides: Green β-SiAlON:Eu, yellow $La_3Si_6N_11$:Ce, orange α-SiAlON:Eu, red $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-x-y}$ (0.5≤x≤3, 0<z<0.3, 0<y≤4) (where, Ln may be at least one type of element selected from the group consisting of Group IIIa elements and rare earth elements, and M may be at least one type of element selected from the group consisting of calcium (Ca), barium (Ba), strontium (Sr), and magnesium (Mg)).

Fluorides: KSF-based red $K_2SiF_6$:$Mn_4^+$, $K_2TiF_6$:$Mn_4^+$, $NaYF_4$:$Mn_4^+$, $NaGdF_4$:$Mn_4^+$, $K_3SiF_7$:$Mn^{4+}$ Phosphor compositions should basically conform to stoichiometry, and respective elements may be substituted with other elements of respective groups of the periodic table. For example, strontium (Sr) may be substituted with barium (Ba), calcium (Ca), magnesium (Mg), and the like within the alkaline earth group (II), and yttrium (Y) may be substituted with lanthanum (La) based elements such as terbium (Tb), lutetium (Lu), scandium (Sc), gadolinium (Gd), and the like. Also, europium (Eu), an activator, may be substituted with cerium (Ce), terbium (Tb), praseodymium (Pr), erbium (Er), ytterbium (Yb), and the like, according to a desired energy level, and an activator may be applied alone or with a co-activator for modifying characteristics of phosphors.

For example, in order to enhance reliability at high temperatures and high humidity, a fluoride-based red phosphor may be coated with a fluoride not containing manganese (Mn) or with organic materials thereon. The organic materials may be coated on the fluoride-based red phosphor coated with a fluoride not containing manganese (Mn). Unlike other phosphors, the fluoride-based red phosphor may realize a narrow full width at half maximum (FWHM) equal to or less than 40 nm, and thus, it may be utilized in high resolution TVs such as UHD TVs.

In certain embodiments, the wavelength conversion material may include quantum dots (QD) provided to be used in place of phosphors, and the QD and the phosphor may be mixed or the QD may be used alone.

The quantum dot may have a core-shell structure including Group II-VI or Group III-V compound semiconductors. For example, the quantum dot may have a core such as CdSe or InP and a shell such as ZnS or ZnSe. Also, the quantum dot may include a ligand to stabilize the core and shell. For example, the core may have a diameter ranging from about 1 nm to 30 nm, and preferably, about 3 nm to 10 nm in an example embodiment. The shell may have a thickness ranging from about 0.1 nm to 20 nm, and preferably, about 0.5 nm to 2 nm in an example embodiment.

The quantum dots may realize various colors according to sizes and, in particular, when the quantum dot is used as a phosphor substitute, it may be used as a red or green phosphor. The use of a quantum dot may realize a narrow FWHM (e.g., about 35 nm).

Figure 14:
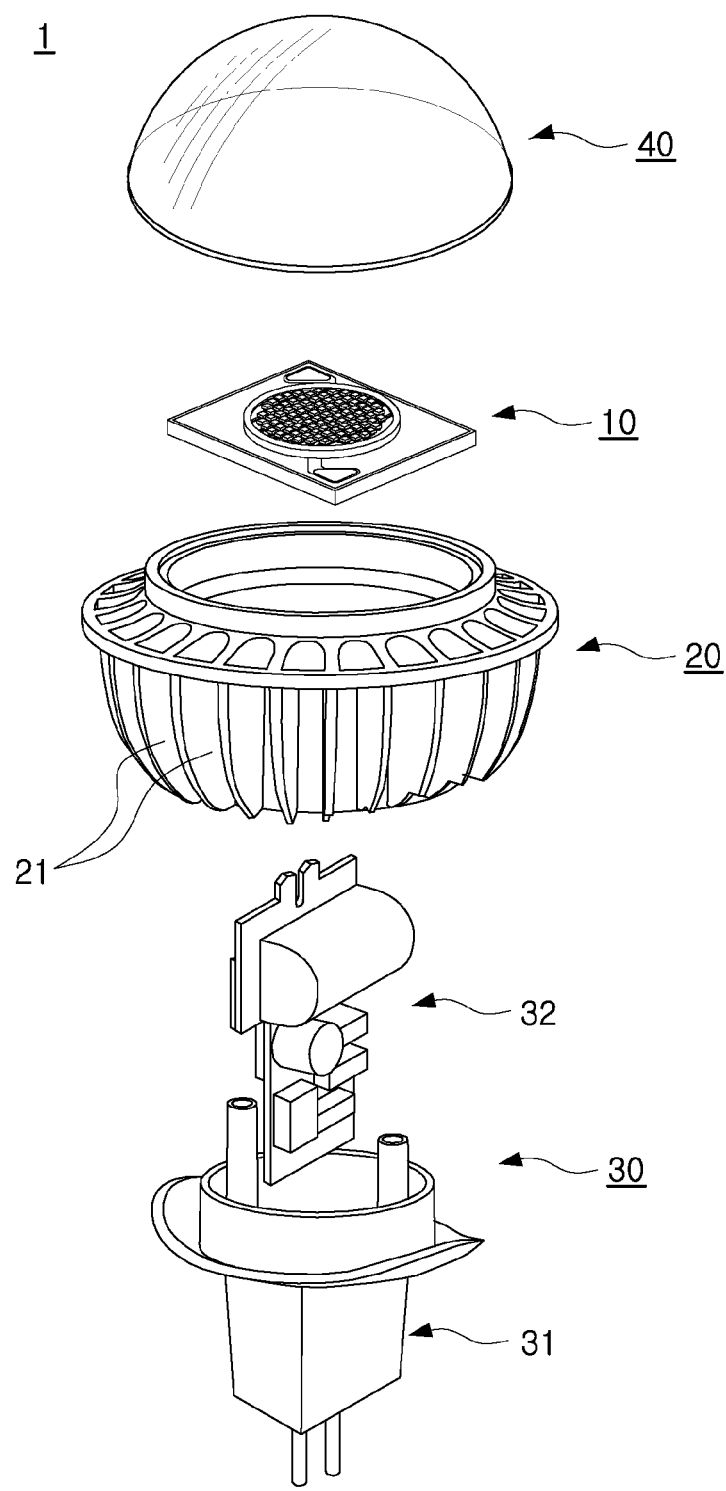
FIG. 14 is an exploded perspective view schematically illustrating a lighting apparatus according to an example embodiment of the present inventive concept.

With reference to FIG. 14, a lighting apparatus according to an example embodiment of the present inventive concept will be described. FIG. 14 is an exploded perspective view schematically illustrating a lighting apparatus according to an example embodiment of the present inventive concept.

Referring to FIG. 14, a lighting apparatus 1 according to an example embodiment of the present inventive concept may be a bulb type lamp and may be used as an indoor lighting apparatus, for example, a down-light. The lighting apparatus 1 may include a base 20 having an electrical connection structure 30 and at least one light emitting device package 10 mounted on the base 20, and may further include a cover part 40 covering the light emitting device package 10.

The light emitting device package 10 may be substantially identical to the light emitting device package 10 of FIG. 1 and thus, a detailed description thereof will be omitted. The embodiment exemplifies a form in which a single light emitting device package 10 is mounted on the base 20, but in certain embodiments, the light emitting device package 10 may be provided in plural.

The base 20 may function as a frame supporting the light emitting device package 10 and function as a heat sink emitting heat generated from the light emitting device package 10, outwardly. To this end, the base 20 may be formed of a stable material having high thermal conductivity, for example, a metal material such as aluminum (Al) or a heat radiating resin.

A plurality of heat radiation fins 21 may be provided on an outer surface of the base 20 in order to increase heat radiation efficiency through an increase of a contact area with the air.

The base 20 may have the electrical connection structure 30 electrically connected to the light emitting device package 10. The electrical connection structure 30 may include a terminal part 31 and a driving part 32 supplying driving power to the light emitting device package 10 through the terminal part 31.

The terminal part 31 may allow the lighting apparatus 1 to be mounted on, for example, a socket or the like, to be fixed and electrically connected thereto. The embodiment illustrates a case in which the terminal part 31 has a slidably inserted pin type structure, but the present inventive concept is not limited thereto. For example, the terminal part 31 may also have an Edison type structure in which it has a screw thread and thus, is turned and inserted.

The driving part 32 may convert external driving power into a current source appropriate for driving the light emitting device package 10 and supply the converted current source thereto. For example, the driving part 32 may be configured of an AC-DC converter, a rectifying circuit part, a fuse or the like. In some cases, the driving part 32 may further include a communications module for implementing remote control.

The cover part 40 may be mounted on the base 20 to cover the light emitting device package 10 and may have a convex lens shape or a bulb shape. The cover part 40 may be formed of a light-transmissive material and may contain a light diffusion material.

Figure 15A:
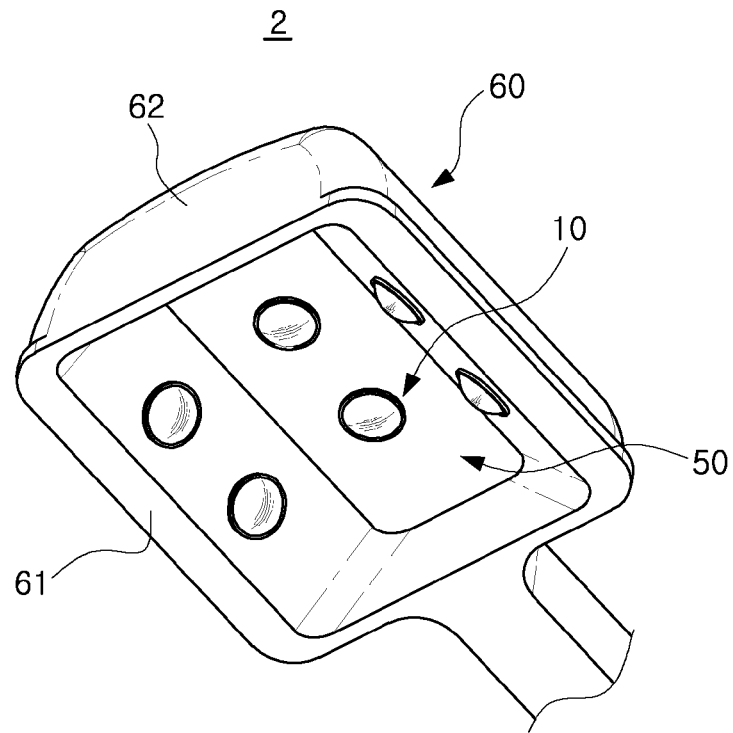
FIG. 15A and FIG. 15B are a perspective view and a cross-sectional view each schematically illustrating a lighting apparatus according to another example embodiment of the present inventive concept.
Figure 15B:
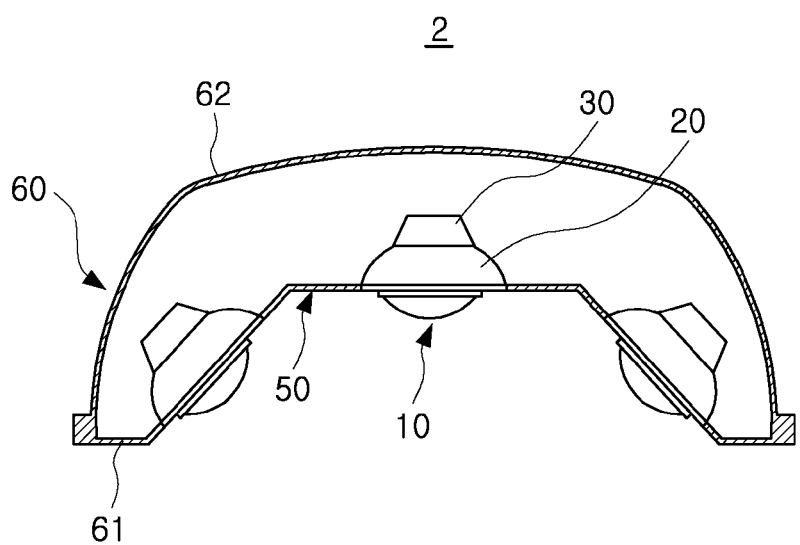

FIGS. 15A and 15B illustrate a lighting apparatus 2 according to another example embodiment of the present inventive concept as a streetlamp. Referring to FIGS. 15A and 15B, the lighting apparatus 2 according to another example embodiment of the present inventive concept may include a housing 60, a reflector 50 mounted on the housing 60, the base 20 having an electrical connection structure 30 and coupled to the reflector 50, at least one light emitting device package 10 being mounted on the base 20.

The electrical connection structure 30, the base 20, and the light emitting device package 10 configuring the lighting apparatus 2 may be substantially identical to the components of the lighting apparatus 1 illustrated in FIG. 14 and thus, a detailed description thereof will be omitted.

The reflector 50 may be formed of a material having high light reflectivity and may contain, for example, a metal material. The housing 60 may include an internal frame 61 and an outer frame 62.

The reflector 50 may be coupled and fixed to the internal frame 61 of the housing 60, and may be covered and protected by the outer frame 62 coupled to the internal frame 61.

As described above, the lighting apparatus using the light emitting device may be classified as an indoor lighting apparatus and an outdoor lighting apparatus. Indoor LED lighting apparatuses may be generally provided to replace or retrofit existing lighting apparatuses, and may include bulb type lamps, fluorescent lamps (LED-tubes), and flat type illumination devices. Outdoor LED lighting apparatuses may include streetlamps, security lamps, floodlighting lamps, scenery lamps, traffic lights, and the like.

The lighting apparatus using LEDs may be employed as internal or external light sources of vehicles. Internal light sources of vehicles may include interior lights, reading lights, dashboard light sources, and the like. External light sources of vehicles may include various light sources such as headlights, brake lights, turn indicators, fog lights, running lights and the like. The vehicles using lighting apparatuses described above embodiments may include automobiles, auto bikes, ships, air planes, space ships, and so on.

In certain embodiments, as light sources used for robots or various mechanical devices, LED lighting apparatuses described above may be used. LED lighting apparatuses using specific waveform bands may promote the growth of plants and may stabilize human emotions or treat illnesses in humans.

Optical designs of lighting apparatuses using light emitting devices may be changed depending on product forms, intended locations, and objects thereof. With regard to mood lighting apparatuses, controlling of such lighting apparatuses may be performed using technologies of controlling a color, a temperature, and brightness of the lighting apparatus, as well as a wireless (remote) control technology employing cellular phones such as smartphones.

Communication functions may be added to the LED lighting apparatuses and display devices to thereby allow for visible light wireless communication technology intended to simultaneously achieve essential purposes of an LED light source and purposes thereof as a communications means.

This because LED light sources may be advantageous, in that they have a relatively long lifespan as compared to existing light sources and excellent power efficiency, allow for the implementation of various colors of light, have a high switching speed for digital communications, and enable digital controlling.

The visible light wireless communications technology may be a wireless communications technology wirelessly transmitting information using light within the visible light wavelength band. The visible light wireless communications technology may be differentiated from existing wired optical communications and infrared wireless communications technologies in that it uses light within visible light wavelength bands, and may be differentiated from wired optical communications technology in terms of wireless communications environments thereof.

In addition, the visible light wireless communications technology may have convenience in that it is able to be freely used without regulations or permission in terms of the frequency of use thereof, unlike in radio frequency (RF) wireless communications, and may have discrimination in that physical security is excellent and communication links are able to be determined visually by a user. Furthermore, the visible light wireless communications technology may have characteristics as a fused technology capable of simultaneously achieving essential purposes of a light source and communications functions thereof.

As set forth above, according to example embodiments of the present inventive concept, a light emitting device package allowing for improvements in reliability and stability in bonding electronic devices to a substrate by soldering or the like, and a lighting apparatus including the same.

While example embodiments have been shown and described above, it will be apparent to those skilled in the art that modifications and variations could be made without departing from the scope of the invention as defined by the appended claims.

What is claimed is:

1. A light emitting device package comprising:
a printed circuit board; and
a plurality of light emitting devices mounted on the printed circuit board,
wherein a first light emitting device of the plurality of light emitting devices comprises first to fourth conductor pads formed discretely on the bottom surface of the light emitting device,
the printed circuit board comprises first to fourth conductor patterns formed discretely on the top surface of the printed circuit board, and
the first to fourth conductor patterns are connected to respective first to fourth conductor pads by respective first to fourth solders,
wherein all of the first to fourth conductor patterns are not electrically connected to each other with respect to electrical connections of the printed circuit board,
wherein at least two of the first to fourth conductor patterns are electrically connected by an electrical connection of the first light emitting device between at least two of the first to fourth conductor pads.

2. The package of claim 1, wherein the first light emitting device is a semiconductor chip comprising first light emitting diode.

3. The package of claim 2, wherein the first conductor pattern is electrically connected to second light emitting device of the plurality of light emitting devices, and the second conductor pattern is electrically connected to third light emitting device of the plurality of light emitting devices.

4. The package of claim 3, wherein the first, second, and third light emitting devices are serially connected to each other through the first and second conductor patterns.

5. The package of claim 4, wherein the third and fourth conductor patterns are connected to each other by a conductor layer formed under the top surface of the printed circuit board.

6. The package of claim 2, wherein the semiconductor chip further comprises second light emitting diode.

7. The package of claim 6, wherein electrical connections of the first and second light emitting diodes are separately operable.

8. The package of claim 6, wherein the first and second light emitting diodes are electrically connected in parallel.

9. A light emitting device package comprising:
a printed circuit board including first to fourth conductor patterns; and
a semiconductor chip mounted on the printed circuit board,
wherein the semiconductor chip comprises first to fourth conductor pads formed on the bottom of the semiconductor chip,
wherein the first to fourth conductor patterns are connected to respective first to fourth conductor pads by respective first to fourth solders,
wherein the semiconductor chip includes at least a first light emitting diode that is configured to emit light upon receiving at least two voltages input respectively through the first and fourth conductor patterns via the first and fourth conductor pads, and
wherein the first conductor pad is configured to output one of the at least two voltages when the at least one light emitting diode is emitting light.

10. The package of claim 9, wherein the first and second conductor patterns are electrically connected to adjacent semiconductor chips respectively, and the third and fourth conductor patterns are substantially the same size and have the same shape as the respective third and fourth conductor pads.

11. The package of claim 10, wherein the first light emitting diode comprises:
first conductivity type semiconductor layer electrically connected to the first conductor pad;
second conductivity type semiconductor layer electrically connected to the second conductor pad; and
an active layer interposed between the first and second conductivity type semiconductor layers,
wherein the second conductivity type semiconductor layer is separated, with respect to a cross sectional view along a line crossing the first conductor pad and the fourth conductor pad.

12. The package of claim 9, wherein the semiconductor chip further comprises second, third and fourth light emitting diodes.

13. The package of claim 12, wherein the first to fourth light emitting diodes are connected in series.

14. The package of claim 9, wherein the second and third conductor patterns are connected to a first conductive wiring of the printed circuit board formed below a top surface of the printed circuit board.

15. A lighting apparatus comprising:
a light emitting device package;
a base on which the light emitting device package is mounted; and a cover covering the light emitting device package,
wherein the light emitting device package comprises:
a printed circuit board including first to fourth discrete conductor patterns;
first light emitting device mounted on the printed circuit board, the first light emitting device comprising first to fourth discrete conductor pads formed on the bottom of the first light emitting device; and
first to fourth solders connecting the first to fourth discrete conductor patterns to respective first to fourth discrete conductor pads,
wherein all of the first to fourth conductor discrete patterns are not electrically connected to each other with respect to electrical connections of the printed circuit board,
wherein at least two of the first to fourth discrete conductor patterns are electrically connected by an electrical connection of the first light emitting device between at least two of the discrete first to fourth conductor pads.

16. The apparatus of claim 15, wherein the first and second discrete conductor patterns are at least partially located under the first light emitting device with respect to a top view.

17. The apparatus of claim 15, wherein all of the third and fourth conductor patterns are located under the first light emitting device with respect to a top view.

18. The apparatus of claim 16, wherein the light emitting device package further comprises second and third light emitting devices, and the first and second discrete conductor patterns are respectively electrically connected to the second and third light emitting devices.

19. The apparatus of claim 18, wherein the first to third light emitting devices are serially connected to each other through the first and second discrete conductor patterns.

20. The apparatus of claim 19, wherein the third and fourth discrete conductor patterns are connected to a first conductive wiring of the printed circuit board formed below a top surface of the printed circuit board.

* * * * *